(12) United States Patent
Kim et al.

(10) Patent No.: US 10,937,650 B1
(45) Date of Patent: Mar. 2, 2021

(54) SEMICONDUCTOR DEVICE HAVING IN SITU FORMED HORIZONTAL NANOWIRE STRUCTURE

(71) Applicant: HRL Laboratories, LLC, Malibu, CA (US)

(72) Inventors: Danny M. Kim, Agoura Hills, CA (US); Rongming Chu, Agoura Hills, CA (US); Yu Cao, Agoura Hills, CA (US); Thaddeus D. Ladd, Woodland Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 16/676,341

(22) Filed: Nov. 6, 2019

Related U.S. Application Data

(62) Division of application No. 15/936,255, filed on Mar. 26, 2018, now Pat. No. 10,535,518.

(60) Provisional application No. 62/476,827, filed on Mar. 26, 2017.

(51) Int. Cl.
  *H01L 21/02* (2006.01)
  *H01L 29/20* (2006.01)
  *H01L 29/06* (2006.01)

(52) U.S. Cl.
  CPC .... *H01L 21/02603* (2013.01); *H01L 21/0242* (2013.01); *H01L 21/0254* (2013.01); *H01L 21/0262* (2013.01); *H01L 21/02389* (2013.01); *H01L 21/02488* (2013.01); *H01L 21/02609* (2013.01); *H01L 21/02639* (2013.01); *H01L 29/0673* (2013.01); *H01L 29/2003* (2013.01)

(58) Field of Classification Search
  CPC .................................................. H01L 29/0673
  See application file for complete search history.

(56) References Cited

U.S. PATENT DOCUMENTS

| | | | |
|---|---|---|---|
| 7,632,742 | B2 | 12/2009 | Paek et al. |
| 7,682,944 | B2 | 3/2010 | Brandes et al. |
| 9,275,857 | B1 | 3/2016 | Hersee |
| 9,711,607 | B1 | 7/2017 | Yang et al. |

(Continued)

OTHER PUBLICATIONS

Murray, R T., et al., Crack initiation and termination in III-V epitaxial layers, Philosophical Magazine, Sep. 21, 2003, pp. 3077-3092, vol. 83, No. 27.

(Continued)

*Primary Examiner* — Walter H Swanson
(74) *Attorney, Agent, or Firm* — North Shore Associates

(57) ABSTRACT

Methods of in situ fabrication and formation of horizontal nanowires for a semiconductor device employ non-catalytic selective area epitaxial growth to selectively grow a semiconductor material in a selective area opening of predefined asymmetrical geometry. The selective area opening is defined in a dielectric layer to expose a semiconductor layer underlying the dielectric layer. The non-catalytic selective area epitaxial growth is performed at a growth temperature sufficient to also in situ form a linear stress crack of nanoscale width that is nucleated from a location in a vicinity of the selective area opening and that propagates in a uniform direction along a crystal plane of the semiconductor layer in both the semiconductor layer and the dielectric layer as a linear nanogap template. The semiconductor material is further selectively grown to fill the linear nanogap template to in situ form the nanowire that is uniformly linear.

4 Claims, 5 Drawing Sheets

(56) References Cited

U.S. PATENT DOCUMENTS

2006/0284218 A1  12/2006  Kaner et al.
2009/0301389 A1  12/2009  Samuelson et al.
2010/0207136 A1   8/2010  Armitage et al.
2017/0178971 A1   6/2017  Merckling et al.

OTHER PUBLICATIONS

Derenge, Michael A., et al., Pendeo-Epitaxy Process Optimization of GaN for Novel Device Applications, U.S. Army Research Laboratory, ARL-TR-4426, Apr. 2008, pp. 1-16 (22 pages total).
Moon, Y. T., et al., In situ pendeoepitaxy of GaN using heteroepitaxial AlGaN/GaN cracks, Applied Physics Letters, 2006, pp. 024103-1 to 024103-3, vol.-Iss. 89.
Tsivion, David, et al, Guided Growth of Millimeter-Long Horizontal Nanowires with Controlled Orientations, Science, Aug. 19, 2011, pp. 1003-1007, vol. 333.

SEMICONDUCTOR DEVICE HAVING IN SITU FORMED HORIZONTAL NANOWIRE STRUCTURE

CROSS-REFERENCE TO RELATED APPLICATIONS

This application is a divisional application of and claims the benefit of priority to parent U.S. patent application Ser. No. 15/936,255, filed Mar. 26, 2018, which claims priority to U.S. Provisional Patent Application No. 62/476,827, filed Mar. 26, 2017, the entire contents of each of which is incorporated by reference herein.

BACKGROUND

1. Technical Field

The invention relates to fabrication of horizontally oriented nanowires. In particular, the invention relates to methods of in situ fabricating nanowires on a planar surface that are oriented horizontally relative to the planar surface during growth of semiconductor structures.

2. Description of Related Art

A variety of semiconductor electronic devices utilize or may benefit by the use of nanometer-scale structures, such as nanowires, for functionality relating to device interconnects, narrow-feature templates, lightwave guiding, and mechanical motion. However, manufacture of such nanowire-based semiconductor devices tends to be difficult and time-consuming, at least due to the growth, and in some cases, placement, of the nanowires for the fabrication of the electronic device. Most methods for synthesizing nanowires focus on producing or growing nanowires that are substantially perpendicular (a vertical orientation) to a substrate surface on which they are grown. Usually nanowire growth is on planar surfaces using a metal catalyst or seed to facilitate growth. However, nanowires have been grown on off-angle structures that are formed on planar substrates, or on cross-sectional ridges using exposed substrate facets, but in each case the nanowire growth is substantially perpendicular to the respective surface. As such, in many cases, the nanowires that are synthesized by these methods have disadvantages including, but not limited to, one or more of characteristically limited length, limited aspect ratios, potential undesirable contours, and unpredictable or random growth locations, which render the nanowires and these techniques undesirable for the applications in which they are needed.

Moreover, in some semiconductor devices that utilize nanowires, the nanowires are intended for a horizontally oriented application, not vertically oriented applications. Therefore, very tedious and time-consuming steps, typically performed manually, are required to not only harvest the vertically oriented nanowires, but also to transfer these nanowires from their growth substrate to an intended location on the host device substrate. Moreover, ways to affix and electrically connect the transferred nanowires in a horizontal orientation at the intended locations on the semiconductor device are needed. As such, these methods have numerous limitations and challenges that have long impacted the semiconductor devices that are intended to use them. Unfortunately, these presently available nanowire growth techniques also limit progress in the development and design complexity of semiconductor devices, such as high performance optical modulators, transistors, LED arrays, photovoltaics, photocatalysts and advanced arrays of high power and high speed devices, that would otherwise benefit from the incorporation of nanowire structures.

While progress with nanowire growth techniques have been made over the years, a more versatile and advanced nanowire growth technique is still needed. In particular, a more versatile nanowire fabrication technique is needed for applications in semiconductor device manufacture that can reduce the existing time consuming and costly efforts of using nanowires that have plagued the semiconductor device industry so far.

BRIEF SUMMARY

In some embodiments of the present invention, a method of fabricating horizontal nanowires in situ on a planar substrate is provided. The method of fabricating comprises patterning a selective area opening of a predefined asymmetrical geometry in dielectric layer to expose an area of an underlying semiconductor layer of a semiconductor material. The method of fabricating further comprises selectively growing the semiconductor material in the selective area opening using non-catalytic selective area epitaxial growth. The non-catalytic selective area epitaxial growth is performed at a growth temperature sufficient to further in situ form a linear stress crack of nanoscale width nucleated at a location in a vicinity of the selective area opening and propagated in a uniform direction in both the underlying semiconductor layer and the dielectric layer along a crystal plane of the underlying semiconductor layer as a linear nanogap template. The method further comprises forming a uniformly linear nanowire in situ using the linear nanogap template. The nanowire is formed comprises further selectively growing the semiconductor material to fill the linear nanogap template using the non-catalytic selective area epitaxial growth at the growth temperature. The in situ formed nanowire is uniformly linear, and horizontally oriented and coplanar with a surface of the planar substrate.

In other embodiments of the present invention, a method of in situ formation of a horizontally oriented gallium nitride (GaN) nanowire structure on a semiconductor device is provided. The method of in situ formation comprises providing a semiconductor device comprising a dielectric layer that overlies a GaN layer on a planar surface of the semiconductor device. The method of in situ formation further comprises defining selective area openings of predefined asymmetrical geometries in the dielectric layer to expose a corresponding underlying area of the GaN layer. The selective area openings are spaced apart on the semiconductor device. The method of in situ formation further comprises forming a GaN growth in the selective area openings. The formation of the GaN growths comprises using non-catalytic selective area epitaxial growth at a growth temperature sufficient to also in situ form a linear nanoscale-width crack in the GaN layer and in the dielectric layer. The linear nanoscale-width crack is nucleated from a location in a vicinity of a first asymmetrical opening of the selective area openings and propagates in a uniform direction along a crystal plane of the GaN layer to a vicinity of a second asymmetrical opening of the selective area openings. The linear nanoscale-width crack provides a linear nanogap template for nanowire growth. The method of in situ formation further comprises selectively growing the GaN to fill the linear nanogap template using the non-catalytic selective area epitaxial growth to in situ form a uniformly linear horizontal GaN nanowire structure having one end adjacent to the formed GaN growth in the first asymmetrical opening and an opposite end adjacent to a GaN growth in the second asymmetrical opening on the semiconductor device.

In some embodiments of the present invention, a semiconductor device with an in situ formed horizontal nanowire structure is provided. The semiconductor device comprises a semiconductor layer of a Group III-V semiconductor material on a planar substrate, and a dielectric layer covering the semiconductor layer. The semiconductor device further comprises a semiconductor growth of the Group III-V semiconductor material having a predefined asymmetrical geometry. The semiconductor growth being coplanar with a surface of the semiconductor device and extending through the dielectric layer to the underlying semiconductor layer. The semiconductor device further comprises a predefined linear crack of nanoscale width in both the dielectric layer and the semiconductor layer. The predefined linear crack extends from a location in a vicinity of the semiconductor growth along a crystal plane of the semiconductor layer. The predefined linear crack comprises a uniformly linear horizontal nanowire structure of the semiconductor material.

BRIEF DESCRIPTION OF THE DRAWINGS

Various features of embodiments in accordance with the principles described herein may be more readily understood with reference to the following detailed description taken in conjunction with the accompanying drawings, where like reference numerals designate like structural elements, and in which.

Figure 1:
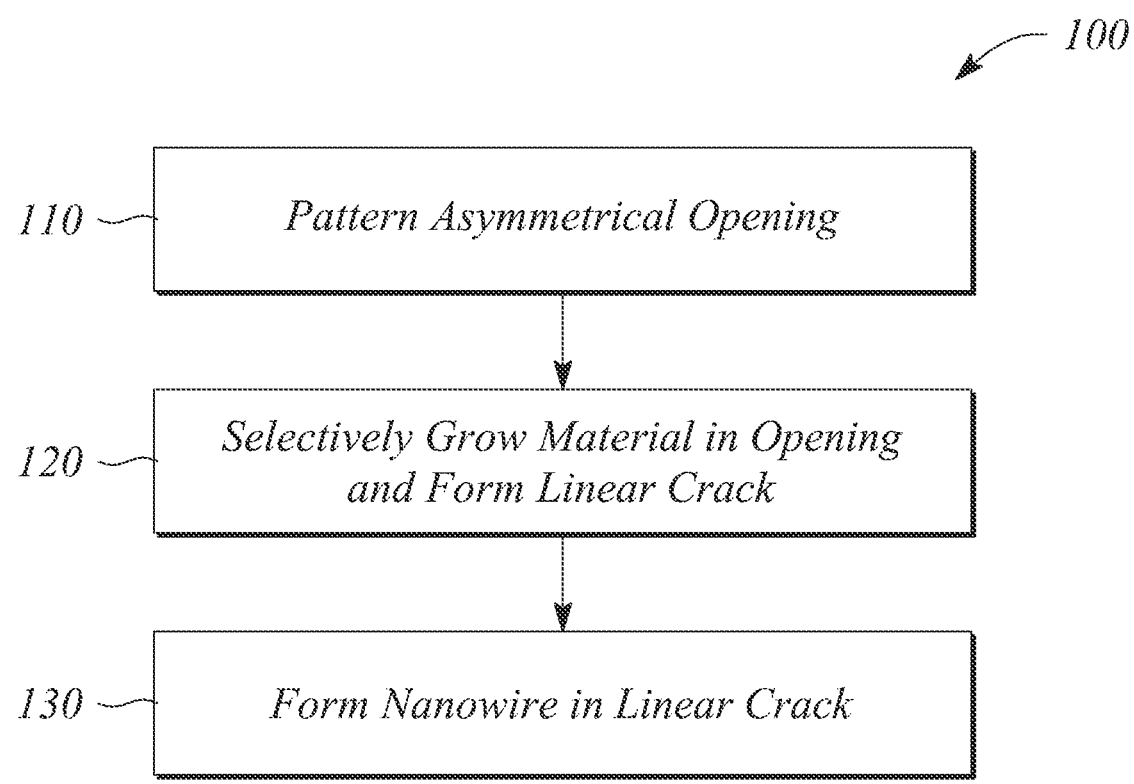
FIG. 1 illustrates a flow chart of a method of fabricating horizontal nanowires in situ on a planar substrate in an example, according to an embodiment consistent with the principles of the present invention.

Certain examples and embodiments have other features that are one of in addition to and in lieu of the features illustrated in the above-referenced figures. These and other features are detailed below with reference to the above-referenced figures.

DETAILED DESCRIPTION

Embodiments of the present invention address difficulties with providing nanowires for use in various semiconductor devices. In particular, the embodiments described herein provide methods to fabricate horizontally oriented nanowires that may more readily facilitate semiconductor device manufacture, development and design complexity. In accordance with principles of the present invention described herein, methods of in situ fabrication of horizontal nanowires on a planar substrate and in situ formation of horizontal nanowire structures on semiconductor devices are provided. Moreover, a semiconductor device that incorporates an in situ formed horizontal nanowire structure is provided. The in situ formed horizontally oriented nanowires may facilitate one or more of optical, electrical and mechanical applications in the semiconductor device, for example.

In particular, embodiments consistent with the principles of the present invention described herein uses selective area epitaxial growth without the use of any catalysts to assist growth or nucleation of growth (hereinafter referred to as, 'non-catalytic selective area epitaxial growth') at semiconductor growth temperatures to in situ form a linear crack with a nanometer-scale wide gap (i.e., 'linear nanogap template') along a crystal plane of a semiconductor layer and to further selectively fill the linear nanogap template with the semiconductor material to in situ form a uniformly linear horizontal nanowire, in place. The crystal plane in which the linear crack forms may be a well-defined or deterministic crystal plane of the semiconductor layer. The uniformly linear horizontal nanowire has a length that may be limited only by the length of the linear crack in the crystal plane. Therefore, the methods described herein are compatible with state of the art semiconductor device fabrication techniques, parameters and equipment and without the need for additional or new equipment and without a catalyst or seed for nanowire growth. Moreover, the methods described herein may provide a way to fabricate nanowire structures, such as large arrays of nanowire networks and nanowire scaffolding for specific applications and may provide a way to fabricate very long nanowires for other applications, depending on semiconductor device needs.

As used herein, the article 'a' is intended to have its ordinary meaning in the patent arts, namely 'one or more'. For example, 'a material' means one or more materials and as such, 'the material' means 'the material(s)' herein. Also, any reference herein to 'top', 'bottom', 'upper', 'lower', 'up', 'down', 'front', back', 'left' or 'right' with respect to direction, or 'first' or 'second' with respect to priority, order or sequence, for example, is not intended to be a limitation herein. Herein, the term 'about' when applied to a value generally means within the tolerance range of the equipment used to produce the value, or may mean plus or minus 20%, or plus or minus 10%, or plus or minus 5%, or plus or minus 1%, unless otherwise expressly specified. Further, the term 'substantially' as used herein means a majority, or almost all, or all, or an amount within a range of about 51% to about 100%. Moreover, examples and embodiments herein are intended to be illustrative only and are presented for discussion purposes and not by way of limitation.

Further in accordance with the principles described herein, the term 'nanowire,' as used herein, means a nanometer-scale (i.e., 'nanoscale') structure having a length that is much longer than its width or thickness. For example, the length of the nanowire may be ten times, or fifty times, or a hundred times, or a thousand times, or more, longer than the nanowire is wide. In some embodiments, the nanowire may have an aspect ratio (length/width) that is within a range of about 10 to about 2000, or more. By 'nanometer scale' or 'nanoscale,' it is meant that the nanowire has a dimension that is relatively small, for example within a range of about 1 nanometer to less than about 10,000 nanometers (or equivalently, about 10 micrometers) compared to the nanowire length. In some embodiments, the relatively small nanoscale dimension of the nanowire is the width or thickness, while the nanowire length is much longer and may be micrometers, millimeters or centimeters in length by comparison.

The term 'horizontal' or 'horizontally oriented,' as used herein, with respect to a nanowire means that a primary extent or the length of the nanowire is coplanar with or parallel to a planar surface or a planar substrate associated with the in situ formation of the nanowire.

The term 'in situ' has its ordinary meaning in the art that includes being situated in an original, natural, or existing place or position. In particular, in situ formation and in situ fabrication, as used herein, mean formed or fabricated in an original place and not moved or relocated for its formation. With respect to a horizontal nanowire, as described herein, a horizontal nanowire is in situ formed or fabricated in place. However, the embodiments herein do not preclude the in situ formed or fabricated horizontal nanowire described herein from being harvested (i.e., subsequently relocated) for use elsewhere.

According to some embodiments of the present invention, a method of fabricating horizontal nanowires in situ on a planar substrate is provided. FIG. 1 illustrates a flow chart of a method 100 of fabricating horizontal nanowires in situ on a planar substrate in an example, according to an embodiment consistent with the principles of the present invention. The method 100 of fabricating horizontal nanowires in situ on a planar substrate comprises patterning 110 a selective area opening of a predefined asymmetrical geometry in a dielectric layer to expose an area of an underlying semiconductor layer of a semiconductor material on the planar substrate.

Figure 2:
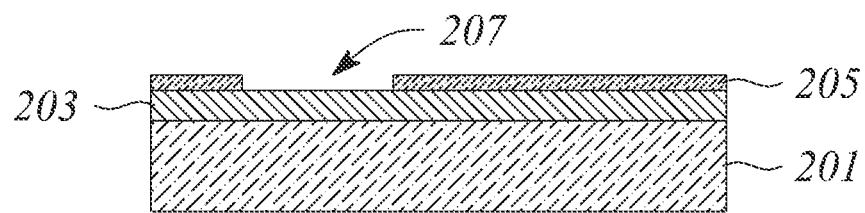
FIG. 2 illustrates a cross sectional view of a planar substrate having a selective area opening patterned in a dielectric layer in accordance with the fabrication method of FIG. 1 in an example, according to an embodiment consistent with the principles of the present invention.

FIG. 2 illustrates a cross sectional view of a planar substrate 201 having a semiconductor layer 203 and a dielectric layer 205 covering the semiconductor layer 203 in an example, according to an embodiment consistent with the principles of the present invention. FIG. 2 further illustrates a selective area opening 207 that is patterned 110 in the dielectric layer 205 to expose an area of the semiconductor layer 203 according to the method 100 of FIG. 1. The planar substrate 201 together with the semiconductor layer 203 may represent a semiconductor wafer. Although not illustrated in the cross sectional view of FIG. 2, the selective area opening 207 has a predefined asymmetrical geometry.

In some embodiments, the predefined asymmetrical geometry of the selective area opening 207 is patterned 110 lithographically (e.g., optical lithographic patterning) using a resist material to mask the dielectric layer and an etching technique to remove the dielectric material, for example, using reactive ion etching. In some embodiments, the asymmetrical geometry of the patterned selective area opening 207 comprises a polygon having asymmetrical dimensions, for example, having a length that differs from a width of the polygon, or a first side that differs in length from a second side, wherein the first side is connected to the second side at a corner or vertex. In some embodiments, the polygon having asymmetrical dimensions include, but are not limited to, an isosceles triangle, a right triangle, a rectangle or another polygonal shape having at least one side that has a dimension different from other sides of the polygonal shape, and a corner or vertex connecting two of the different dimension sides.

According to various embodiments described herein, the asymmetrical geometry of the selective area opening to be patterned 110 may be determined a priori to provide a localized nucleation point, as described further below. In some embodiments, a corner or vertex of the predefined asymmetrical geometry has a radius of curvature of about 1 micrometer, with the polygon having a major axis along a {10-10} crystal plane or a {11-20} crystal plane of the semiconductor layer 203. In the example in FIG. 2, the asymmetrical selective area opening 207 is a rectangle having four corners or vertices, by way of example and not limitation (e.g., see FIG. 4C and description below).

In some embodiments, the area of predefined asymmetrical geometry to be patterned 110 is a polygon with an aspect ratio (length/wide) equal to or greater than about 2. In some examples, the aspect ratio may be within a range of about 1.5 to about 6, depending on the embodiment. In some embodiments, the polygonal patterned area comprises a first side that is longer than a second side. The second side may have a length within a range of about 15 micrometers (or 'microns') to about 25 microns, wherein a first side-to-second side aspect ratio is equal to or greater than about 2, or equal to or greater than about 4, or equal to or greater than about 6, or in some embodiments, may be greater than 6. In some embodiments, the predefined asymmetrical geometry of the selective area opening comprises a first vertex having a radius of curvature of about 1 micron and an adjacent second vertex. The first vertex is spaced from the adjacent second vertex by a length of a side of the selective area opening that is in a range of more than about 15 microns to about 25 microns. Moreover, one or both of the first vertex and the adjacent second vertex has a face angle equal to or less than about ninety degrees.

Referring back to FIG. 1, the method 100 of fabricating horizontal nanowires in situ on a planar substrate further comprises selectively growing 120 the semiconductor material in the patterned selective area opening. Selectively growing 120 the semiconductor material uses a non-catalytic selective area epitaxy technique at a growth temperature to grow the semiconductor material selectively in the patterned selective area opening. By 'non-catalytic' it is meant that the selective area epitaxial growth of the semiconductor material does not use and is not facilitated by any catalyst seed. Moreover, the non-catalytic selective area epitaxy growth temperature is sufficient to further in situ form a linear stress crack of nanoscale width in both the semiconductor layer and the dielectric layer during selective growing 120 the semiconductor material. The linear stress crack provides a linear nanogap template for nanowire growth. By 'nanogap' it is meant that the linear stress crack provides a gap (or trench) in the semiconductor layer and the dielectric layer that has a width dimension that is nanoscale, as described above. In some embodiments, the width of the tensile stress crack (or the nanogap) may be within a range of about 10 nanometers (nm) wide to about 50 nm wide, while the length of the tensile stress crack may be hundreds of micrometers to centimeters long.

The linear stress crack nucleates at a location of the patterned asymmetrical selective area opening and propagates in a uniform direction along a crystal plane the semiconductor layer to provide the linear nanogap template. In some embodiments, the location of the linear stress crack nucleation point may be predetermined. By 'predetermined' it is meant that the information may be determined beforehand, a priori, or estimated from information about materials and parameters used for non-catalytic selective area epitaxial growth. In particular, information about the semiconductor material used to form the semiconductor layer and the asymmetrical geometry used for the selective area opening are considerations. In some embodiments, factors to consider in predetermining the nucleation location of the linear stress crack may include, but are not limited to, one or more of the crystal structure of the semiconductor material, the temperature characteristics of the semiconductor material, the tensile characteristics of semiconductor material, the asymmetrical geometry of the patterned area, the location and the positioning of the asymmetrical selective area opening relative to the semiconductor crystal structure, and the selective area epitaxy parameters used (e.g., growth temperature, growth rate, flux ratios).

Figure 3A:
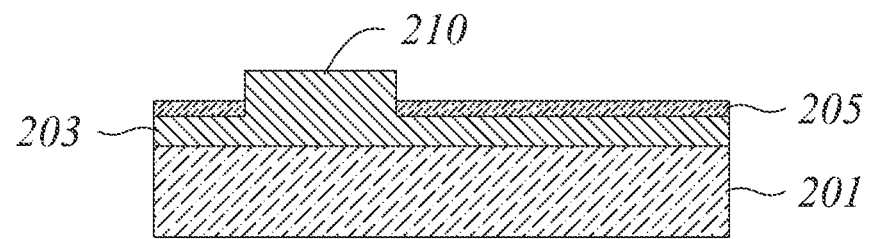
FIG. 3A illustrates a cross sectional view of the planar substrate having a semiconductor growth in the selective area opening of FIG. 2 in accordance with the fabrication method of FIG. 1 in an example, according to an embodiment consistent with the principles of the present invention.
Figure 3B:
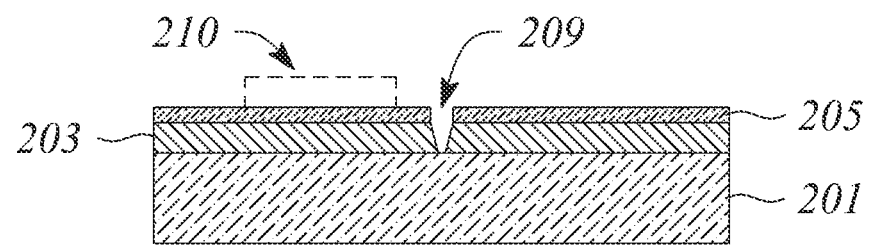
FIG. 3B illustrates a different cross sectional view of the planar substrate relative to FIG. 3A having a crack in both a dielectric layer and a semiconductor layer in accordance with the fabrication method of FIG. 1 in an example, according to an embodiment consistent with the principles of the present invention.

FIGS. 3A-3B illustrate different cross sectional views of the planar substrate during selectively growing 120 the semiconductor material using non-catalytic selective area epitaxial at the growth temperature according to the method 100 of FIG. 1 in an example, according to an embodiment consistent with the principles of the present invention. Referring to FIG. 3A, during selectively growing 120 the semiconductor material, the asymmetrical selective area opening 207 is filled with the semiconductor material to form a semiconductor growth 210 of corresponding asymmetry to the patterned selective area opening 207, using non-catalytic selective area epitaxy. Moreover, referring to FIG. 3B, during selectively growing 120 the semiconductor material, a stress crack 209 is in situ formed in the underlying semiconductor material layer 203 that is also propagated in the overlying dielectric layer 205 to the planar substrate surface. Not shown in the cross sectional view of FIG. 3B is that the stress crack 209 is uniformly linear and is propagated along a crystal plane of the semiconductor layer 203 (to provide a 'linear nanogap template' 209).

In some embodiments, the predefined asymmetrical geometry of the patterned selective area opening may impart sufficient localized stress (e.g. at a corner of an asymmetric polygon, as described above) to overcome a threshold for crack formation in the semiconductor crystal at the growth temperature. Another factor to consider in predetermining where the crack will nucleate includes, but is not limited to, a size of the patterned selective area opening (in the dielectric mask layer), which may be proportional to an amount of stress that may be imparted to the substrate (e.g., that includes the semiconductor layer) during the non-catalytic selective epitaxial growth. Moreover, the asymmetrical geometry may affect the way the stress is applied to the substrate versus stress relaxation mechanisms. For example, a symmetrical geometric opening, such as a circle (i.e., that does not have corners or vertices), may relax strain by its gradual shape; however an asymmetrical geometric opening may frustrate this stress relaxation and impart stress to the substrate asymmetrically, for example due to its asymmetrical geometry having corners, as described above.

In some embodiments, the nucleation point for the tensile stress crack may be predetermined to be at or adjacent to a corner of the patterned selective area opening of predefined asymmetrical geometry. For example, a corner of the asymmetrical selective area opening that is aligned with a well-defined or deterministic crystal plane of the semiconductor layer may create a localized tensile stress point at the growth temperature, in particular if the asymmetrical geometry of the selective area opening provides a corner or vertex with the dimensional characteristics described above (e.g., that is not curved).

Referring again to FIG. 1, the method 100 of fabricating horizontal nanowires in situ on a planar substrate further comprises forming 130 a nanowire in situ using the linear nanogap template that was in situ formed by the linear stress crack during selectively growing 120. The nanowire is in situ formed 130 comprising further selectively growing the semiconductor material to fill the linear nanogap template using the non-catalytic selective area epitaxy at the growth temperature. The in situ formed 130 nanowire is uniformly linear, horizontally oriented and coplanar with a surface of the planar substrate. The further selective growth substantially fills the linear stress crack to at least the dielectric layer surface, and also may overfill at the dielectric surface and slightly laterally overlap edges of the linear stress crack. In some embodiments, the semiconductor material non-catalytically grows selectively in the linear nanogap template to slightly overflow at the dielectric layer surface (e.g., via epitaxial lateral overgrowth (ELO)), while maintaining a uniform nanoscale width, as defined herein.

Figure 4A:
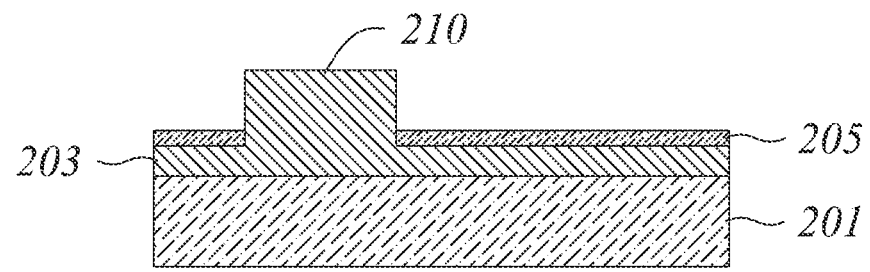
FIG. 4A illustrates a cross sectional view of the planar substrate with the semiconductor growth enhanced in height relative to FIG. 3A in accordance with the fabrication method of FIG. 1 in an example, according to an embodiment consistent with the principles of the present invention.
Figure 4B:
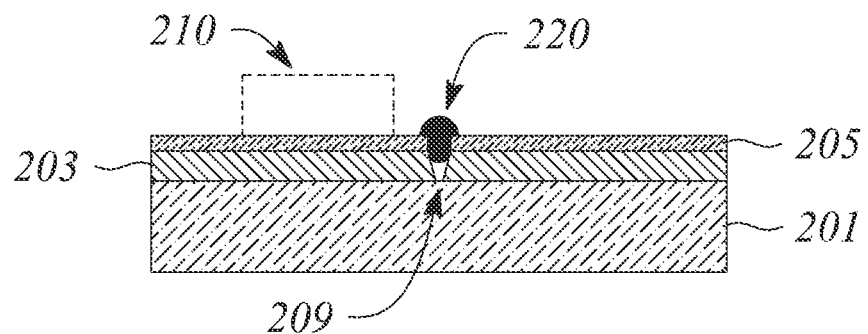
FIG. 4B illustrates a different cross sectional view of the planar substrate relative to FIG. 4A having a nanowire in situ grown in the crack illustrated in FIG. 3B in accordance with the fabrication method of FIG. 1 in an example, according to an embodiment consistent with the principles of the present invention.

FIGS. 4A-4B illustrate different cross sectional views of the planar substrate during forming 130 a nanowire in situ in accordance with the method 100 of FIG. 1 in an example, according to according to an embodiment consistent with the principles of the present invention. During the formation 130 of the nanowire, the semiconductor material continues to further selectively grow on the semiconductor growth 210 to increase a height of the asymmetrical semiconductor growth 210. Referring to FIG. 4A, the further selective growth on the asymmetrical semiconductor growth 210 is illustrated by an increased height of the semiconductor growth 210 relative to FIG. 3A. FIG. 4B illustrates a nanowire 220 in situ grown in the crack 209 of the linear nanogap template (with slight overgrowth, for example) relative to FIG. 3B.

As provided herein, the non-catalytic selective area epitaxial growth at the growth temperature does not use any catalyst for the selective growth of the semiconductor material in the selective area opening or in the linear nanogap template, as described herein, in accordance with the principles described herein. Instead, the semiconductor material that exists in the underlying semiconductor layer itself may facilitate nucleation of the selective epitaxial growth of the semiconductor material. Therefore, the horizontally oriented, uniformly linear nanowire is in situ formed 130 in the linear nanogap template non-catalytically without a catalyst or seed.

Figure 4C:
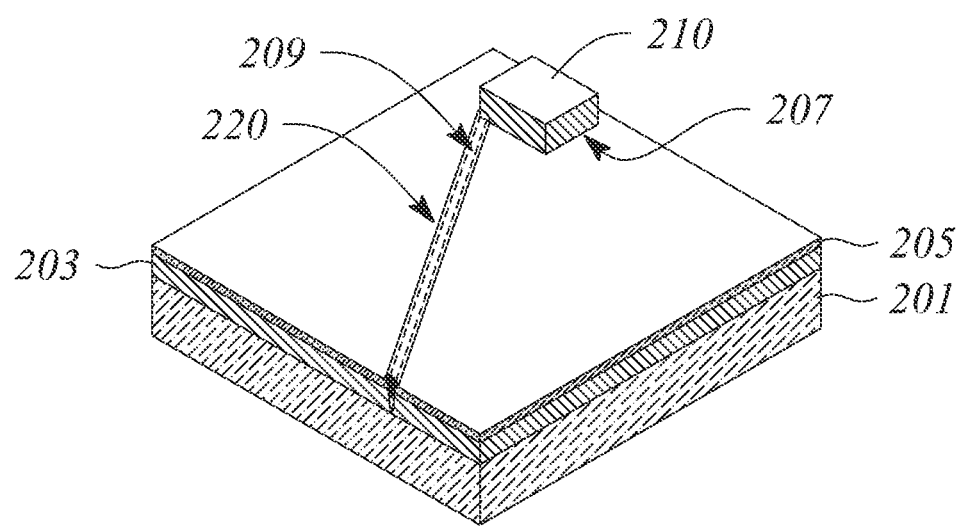
FIG. 4C illustrates a perspective view of the planar substrate of FIGS. 4A-4B with the in situ grown nanowire in the crack extending from the semiconductor growth in accordance with the fabrication method of FIG. 1 in an example, according to an embodiment consistent with the principles of the present invention.

FIG. 4C illustrates a perspective view of the planar substrate 201 of FIGS. 4A-4B with the nanowire 220 in the linear stress crack 209 (illustrated by a dashed-line in FIG. 4C) extending from the semiconductor growth 210 in an example using the fabrication method 100 of FIG. 1, according to an embodiment consistent with the principles of the present invention. FIG. 4C also illustrates the asymmetrical geometry of the selective area opening 207 from which the semiconductor growth 210 extends in this example. As provided above, the asymmetrical selective area opening 207 is a rectangle, by way of example and not limitation.

In accordance with the method 100 of in situ fabricating horizontal nanowires, the non-catalytic selective area epitaxy used during selective growth 120 and further selective growth during forming 130 a nanowire may be performed using various standard crystal growth methods and equipment for semiconductor materials including, but not limited to, metal organic chemical vapor deposition (MOCVD), chemical beam epitaxy (CBE), or molecular beam epitaxy (MBE). The growth temperature used for the non-catalytic selective area epitaxy may depend on factors including, but not limited to, one or more of the semiconductor material chosen, the substrate material chosen, the mask material chosen for the dielectric layer, other growth parameters such as gas flow rates and pressure, and parameters of the various material layers, such as thickness of one or both of the semiconductor material layer and the dielectric layer, for example.

In some embodiments of the method 100 of horizontal nanowire in situ fabrication, the growth temperature that is sufficient to both in situ form a linear stress crack and selectively grow the semiconductor material is equal to or greater than about 900° C. Depending on the embodiment, the growth temperature may be within a range of about 900° C. to about 1200° C. In some embodiments, the growth temperature is within the range of about 1000° C. to about 1100° C., for example, for Group III-V semiconductor materials, such as Group III-nitride materials, and including gallium nitride (GaN). In some embodiments, the growth temperature may be within the range of about 1020° C. to about 1080° C., for example to selectively grow gallium nitride (GaN). Moreover, the selective area epitaxial growth may include the incorporation of dopant materials to facilitate optical, electrical or mechanical properties of the in situ formed 130 nanowire. For example, standard p-type and n-type dopant materials may be used to vary an electrical conductivity of the in situ formed 130 nanowire.

In some embodiments, the planar substrate comprises a sapphire wafer having gallium nitride (GaN) semiconductor material layer on a planar surface of the sapphire wafer. Other substrate materials that may be useful for the various embodiments herein include, but are not limited to, another wafer and semiconductor material combination with similar properties to a sapphire wafer with a GaN surface layer.

Examples of the semiconductor materials that are useful for the various embodiments herein include, but may not be limited to, a compound semiconductor from Group III and Group V of the Periodic Table of the Elements, for example. In some embodiments, the semiconductor material is a compound semiconductor having one element from the Group V and one element of the Group III. Examples of such Group III-V compound semiconductors include one of indium (In) and gallium (Ga) from Group III with nitrogen (N) from Group V. In some embodiments, the semiconductor material is a Group III-nitride compound semiconductor. For example, the semiconductor material may be a compound semiconductor of indium nitride (InN), gallium nitride (GaN), or an intermediary alloy of either of InN or GaN, that may include some aluminum, for example. In some embodiments, the Group III-nitride compound semiconductor material is entirely gallium nitride (GaN).

In particular, GaN has a crystal structure that includes both polar and non-polar crystal planes, such as a-planes with a-plane-normal crystal axes <11-20> and m-plane-normal crystal axes <10-10>, which may be described as 'well-defined' or 'deterministic'. Tensile stress cracks may be formed, for example, along the a-plane <11-20> crystal axes and may be predetermined to originate or nucleate by tensile stress at corners of the patterned selective area opening of predefined asymmetric geometry. Moreover, GaN is a material that has well-known properties, for example, properties that are useful for high-voltage electronic devices, light emitting diode devices, and high temperature quantum optoelectronic devices, for example. Therefore, GaN is an attractive option for in situ horizontal nanowire growth in accordance with the principles described herein.

The dielectric layer provides a mask material and may provide insulation properties as well as dielectric functions for device structures. Examples of a mask material for the dielectric layer include, but are not limited to, oxides, for example, an oxide of silicon, such as a silicon oxide or silicon dioxide ($SiO_2$), or a nitride such as silicon nitride ($Si_3N_4$). The dielectric layer may be deposited using a standard deposition technique including, but not limited to, plasma enhanced chemical vapor deposition (PECVD), low pressure chemical vapor deposition (LPCVD), or inductively coupled plasma chemical vapor deposition (ICP-CVD). In some embodiments, the dielectric layer is deposited on the semiconductor layer using PECVD. Moreover, patterning the dielectric layer to form the asymmetrical selective area opening may be performed using a lithographic resist material and etching, for example using an optical resist material and reactive-ion etching (ME) or a buffered oxide etch (BOE), which are readily available.

In some embodiments, silicon dioxide is used to provide the dielectric or mask layer at least because it may be deposited and lithographically patterned using standard techniques and equipment. For example, silicon dioxide may be lithographically patterned and etched using ME with a fluorine-containing gas etchant. Moreover, an asymmetrical geometric (e.g., polygonal) patterned selective area opening may be predefined in the silicon dioxide dielectric layer with corners and straight sides, as described above, using the standard patterning techniques. In addition, silicon dioxide as the mask material and dielectric layer can withstand high deposition or growth temperatures, as described above, and does not support epitaxial growth of semiconductor materials, such as GaN, for example, on its surface. Silicon dioxide also may be selectively etched after nanowire formation 130 to remove portions of the silicon dioxide around the horizontal nanowire, for example, without imparting damage to surrounding structures.

In some examples of the method 100 of fabricating horizontal nanowires in situ on a substrate, a planar semiconductor wafer, such as a sapphire wafer, is provided. The planar semiconductor wafer comprises a GaN semiconductor material layer on the sapphire wafer, where the GaN is covered with a silicon dioxide layer, for example to a thickness of about 50 nanometers. During patterning 110, the silicon dioxide layer is patterned to provide selective area openings of a predefined asymmetric geometry, for example asymmetrical polygons that are spaced apart in predetermined positions relative to deterministic or well-defined crystal planes of the GaN to nucleate linear stress cracks. Moreover, in some examples, during selective growth 120 of GaN, linear stress cracks are formed in and along predetermined <11-20> crystal axes in uniform directions of deterministic crystal a-planes of the GaN. In particular, in some examples, the linear stress cracks may be nucleated at or adjacent to predetermined corners of the polygonal asymmetric patterned selective area openings.

In some embodiments of selectively growing 120 the semiconductor material in the patterned selective area opening using non-catalytic selective area epitaxial growth, GaN semiconductor material is selectively grown 120 at a growth temperature within a range of about 1000° C. to about 1100° C. In some embodiments, the GaN is selectively grown 120 and is further selectively grown during the nanowire formation 130 in a volume flux ratio of the GaN precursor materials (e.g., ammonia ($NH_3$) and trimethylgallium (TMG)) that is within a $NH_3$-to-TMG ('$NH_3$/TMG') ratio range of about 10 $NH_3$/TMG to about 30 $NH_3$/TMG, during the non-catalytic selective area epitaxial growth of the GaN. In an example, the volume flux ratio of the $NH_3$-to-TMG is within the ratio range of about 15 $NH_3$/TMG to about 25 $NH_3$/TMG, and the growth temperature is within a range of about 1020° C. to about 1080° C. Moreover, in some embodiments, the GaN is selectively grown using metal oxide chemical vapor deposition (MOCVD) during the non-catalytic selective area epitaxial growth of the GaN.

More generally, in some embodiments of the method 100 of fabricating horizontal nanowires in situ on a substrate, the semiconductor material is a compound semiconductor material of Group III-V, as described above. The Group III-V semiconductor material comprises using one element from the Group V and one element of the Group III of the compound semiconductor material. The compound semiconductor material is selectively grown in the patterned selective area opening in a volume flux ratio of precursor materials for the Group V element-to-the Group III element ('Group V/Group III') that is within a range of about 10 Group V/Group III to about 30 Group V/Group III, or about 15 Group V/Group III to about 30 Group V/Group III, or about 20 Group V/Group III to about 30 Group V/Group III, for example, depending on the chosen elements from Group V and Group III.

In an example according to these embodiments, the semiconductor material is a Group III-nitride compound semiconductor. The Group III-nitride compound semiconductor is selectively grown from a flux of the precursor material for nitride (e.g., ammonia) and a precursor material of the Group III element. A volume flux ratio of these precursor materials, i.e., the nitride-to-the Group III materials, (nitride/Group III' ratio) is within a volume flux ratio range of about 10 nitride/Group III to about 30 nitride/Group III, or about 15 nitride/Group III to about 30 nitride/Group III. In an example, the volume flux ratio may be about 20 nitride/Group III at a temperature within the range of about 1000° C. to about 1100° C.

In some embodiments, a low molecular ratio (Group V to Group III) provides a relatively fast (10-11) growth rate, for example, using a volume flow Groups VIII ratio of about 10 to about 50, with a planar equivalent growth rate of about 1 micron per hour to about 5 microns per hour at a temperature of greater than 1000° C. For example, with patterned selective area openings of predefined asymmetrical geometry that are greater than about 25 microns to about 50 microns in a dimension, and that have corner features, selectively growing 120 the Group III-V semiconductor creates localized tensile stress which induces cracking in the underlying Group III-V semiconductor layer (e.g., GaN).

In some embodiments of the method 100 of fabricating horizontal nanowires in situ on a substrate, the in situ formed uniformly linear nanowire has an aspect ratio (length/width) that is equal to or greater than 1000. In some embodiments, the aspect ratio is within a range of about 10 to about 2000, or the aspect ratio may be greater than 2000, for example, depending on the length of the linear stress crack that is in situ formed during selectively growing 120 the semiconductor material. In some embodiments, the uniformly linear horizontal nanowire is a Group III-nitride nanowire that selectively grows along six <11-20> directions of the Group III-nitride crystal during the in situ nanowire formation 130. In some embodiments, the uniformly linear horizontal nanowire is a GaN nanowire.

In some embodiments, the uniformly linear horizontal nanowire has a triangular profile in cross section with (0001), {10-11} facets. The nanowire grows along the surface with a bottom (000-1) facet of the nanowire located on the substrate surface. In some embodiments, the horizontal nanowire has minimal tapering, and may have no tapering, along the length of the horizontal nanowire. Moreover, the horizontal nanowire growth may self-terminate near other horizontal nanowires, and in addition, may self-connect to other structures to complete one or more of electrical, optical and mechanical connections, for example. Parameters that may affect the self-joining and self-terminating behavior of the horizontal nanowire may involve a lack of kinetic energy associated with the linear stress crack formation in a vicinity of other cracks or structures (for example, see R. T. Murray et al., "Crack initiation and termination in III-V epitaxial layers," *Philosophical Magazine,* 21 Sep. 2003, Vol. 83, No. 27, pages 3077-3092, incorporated by reference).

Figure 5:
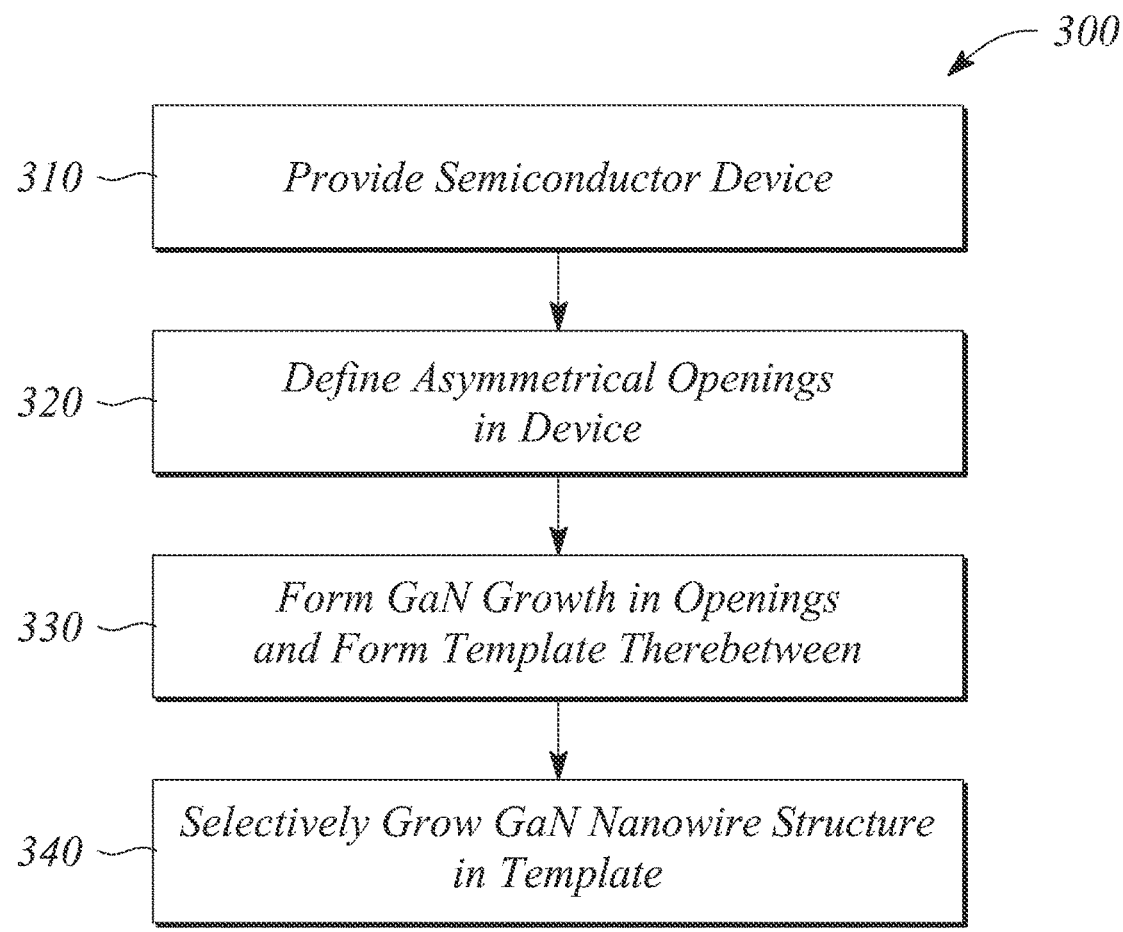
FIG. 5 illustrates a flow chart of a method of in situ formation of a gallium nitride (GaN) horizontal nanowire structure on a semiconductor device in an example, according to an embodiment consistent with the principles of the present invention.

In some embodiments of the present invention, a method of in situ formation of a gallium nitride (GaN) nanowire structure on a semiconductor device is provided. FIG. 5 illustrates a flow chart of a method 300 of in situ formation of a GaN nanowire structure on a semiconductor device in an example, in accordance with the principles described herein. The method 300 of in situ formation of a GaN nanowire structure comprises providing 310 a semiconductor device that comprises a dielectric layer that overlies a GaN layer on a planar surface of the semiconductor device.

The method 300 of in situ formation of a GaN nanowire structure further comprises defining 320 selective area openings of individual predefined asymmetrical geometries in the dielectric layer to expose corresponding underlying areas of the GaN layer. The asymmetrical selective area openings are spaced apart on the semiconductor device. The asymmetrical selective area openings have individual dimensions and characteristics that may be substantially equivalent to the dimensions and characteristics described above for the selective area opening of predefined asymmetrical geometry in accordance with the method 100 of fabricating horizontal nanowires in situ on a substrate.

For example, in some embodiments, the predefined asymmetrical geometries of the defined 320 selective area openings may be polygonal, each with a respective aspect ratio that is within a range of about 2 to about 6. Moreover, the asymmetrical polygons may have at least one corner between two sides of the respective polygon. In some embodiments, defining 320 selective area openings in the dielectric layer uses lithography and etching, for example, optical lithography and RIE. In some embodiments, defining 320 selective area openings of the method 300 may be substantially equivalent to patterning 110 a selective area opening, as described above, in the method 100 of fabricating horizontal nanowires in situ on a substrate.

As illustrated in FIG. 5, the method 300 of in situ formation of a GaN nanowire structure further comprises forming 330. GaN growths in the defined 320 selective area openings using non-catalytic selective area epitaxial growth at a growth temperature. The growth temperature used is sufficient to also in situ form a linear nanoscale-width stress crack in the GaN layer and the overlying dielectric layer during forming 330 the GaN growths. In particular, the linear nanoscale-width stress crack is nucleated from a location in a vicinity of a first asymmetrical opening of the selective area openings and propagates in a uniform direction along a crystal plane of the GaN layer to a vicinity of a second asymmetrical opening of the selective area openings. As such, the linear nanoscale-width stress crack provides a linear nanogap template for growing a nanowire structure between formed 330. GaN growths in two asymmetrical selective area openings. In some embodiments, the formation 330 of the GaN growths in accordance with the method 300 may be substantially similar to selective growing 120 the semiconductor material, including the in situ formation of a linear stress crack as a linear nanogap template, as described above, for the method 100 of fabricating horizontal nanowires in situ on a substrate.

Further, with respect to FIG. 5, the method 300 of in situ formation of a GaN nanowire structure further comprises selectively growing 340 the GaN to fill the linear nanogap template using the non-catalytic selective area epitaxial growth. The GaN-filled linear nanogap template in situ forms a uniformly linear horizontal GaN nanowire structure. One end of the in situ formed nanowire structure is adjacent to a GaN growth in the first asymmetrical opening and an opposite end of the in situ formed nanowire structure is adjacent to a GaN growth in the second asymmetrical opening on the semiconductor device. In some embodiments, selectively growing 340 the GaN to fill the linear nanogap template to in situ form the uniformly linear horizontal GaN nanowire structure according to the method 300 also may be substantially similar to forming 130 a nanowire in situ using the linear nanogap template, as described above for the method 100 of fabrication.

In particular, in some embodiments of the method 300 in situ formation, the crystal plane that the linear stress crack propagates along may be a well-defined or deterministic a-plane crystal lattice path along a GaN <11-20> crystal axis. Moreover, in some embodiments of the method 300 of in situ formation, the non-catalytic selective area epitaxial growth temperature is greater than 900° C., and in some embodiments, may be within a range of about 1000° C. to about 1100° C. In some embodiments of the method 300 of in situ formation, the non-catalytic selective area epitaxial growth of the GaN is performed in a MOCVD chamber using a flux of ammonia ($NH_3$) and trimethylgallium (TMG) in a volume flux ratio of the $NH_3$ to the TMG ($NH_3$/TMG) that is within range of about 10 $NH_3$/TMG to about 30 $NH_3$/TMG to form 330 the GaN growths in the selective area openings and to selective grow 340 the GaN in the linear nanogap template.

Figure 6:
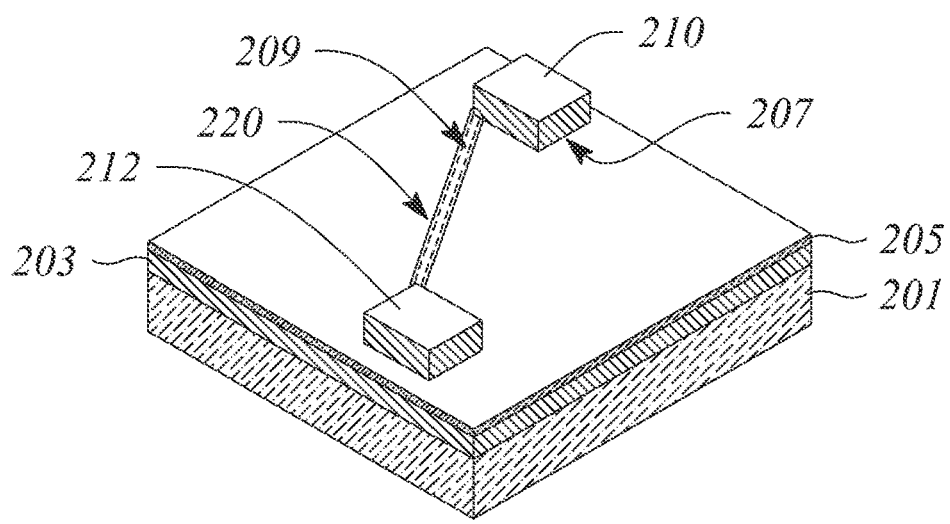
FIG. 6 illustrates a perspective view of a semiconductor device having an in situ formed horizontal nanowire structure in an example, according to an embodiment consistent with the principles of the present invention.

FIG. 6 illustrates a perspective view of a semiconductor device having an in situ formed horizontal nanowire structure in an example, according to an embodiment consistent with the principles of the present invention. In some embodiments, the horizontal nanowire structure 220 is in situ formed on a semiconductor device using the method 300, as described herein. The in situ formed horizontal nanowire structure 220 is in a nanogap template of the linear crack 209 (illustrated by a dashed-line in FIG. 6). The linear crack 209 and the horizontal nanowire structure 220 extend between a first semiconductor growth 210 and a second semiconductor growth 212. The illustrated first and second semiconductor growths 210, 212 may represent the GaN growths in the first and second asymmetrical openings, respectively, described herein for the method 300. The GaN growths 210, 212 extend through the respective first and second asymmetrical openings in the dielectric layer 205 to the semiconductor layer 203 on the planar substrate 201.

In some embodiments, the uniformly linear horizontal GaN nanowire structure grows in six well-defined crystallographic directions in the linear nanogap template during the selective growth 240. Moreover, the uniformly linear horizontal GaN nanowire structure may have an aspect ratio of length-to-width that is within a range of about 10 to about 2000. In some examples, the aspect ratio of the uniformly linear horizontal GaN nanowire structure may be larger or smaller, depending on the distance between the respective selective area openings or the GaN growths therein. Moreover, the uniformly linear horizontal nanowire structure may be one or both of self-terminating and self-joining. For example, the horizontal GaN nanowire structure may self-join with the GaN growth in another selective area opening. In another example, the horizontal GaN nanowire structure may self-terminate just short of making contact with other in situ formed horizontal nanowires. In some embodiments, the characteristics or properties of the uniformly linear horizontal GaN nanowire structure in situ formed according to the method 300 may be substantially similar to those of the uniformly linear horizontal nanowire described above for the method 100 of fabricating horizontal nanowires in situ on a substrate.

Moreover, the uniformly linear horizontal GaN nanowire structure in situ formed in accordance with the method 300 may comprise one or more of optical, electrical and mechanical characteristics or properties. In some embodiments of the method 300, a coating may be applied to the GaN nanowire structure to facilitate a targeted property or characteristic for use in the semiconductor device. In some embodiments, dopant materials or other additives may be included during the non-catalytic selective area epitaxial growth to adjust one or more of the optical, electrical and mechanical characteristics the GaN nanowire structure. Moreover, in some embodiments, the semiconductor device comprising the GaN nanowire structure may be one or more of an optical component, an electrical component and a mechanical component of a system. For example, the semiconductor device may be a component of an optical waveguide, a high performance optical modulator, a transistor, a LED array, a laser, a chemical sensor, a piezo-electric transducer, a photovoltaic cell, a photodetector, a photocatalyst, or an array of solid-state spin quantum bits.

While not illustrated in FIG. 5, the method 300 of in situ formation of a gallium nitride (GaN) nanowire structure may further comprise at least partially suspending the uniformly linear horizontal GaN nanowire structure between the two GaN growths in some embodiments. In these embodiments, a portion of the dielectric layer around the uniformly linear horizontal GaN nanowire structure is selectively removed to suspend the nanowire structure. Suspending the uniformly linear horizontal GaN nanowire between two GaN growths may provide additional options for the design or the layout of particular semiconductor devices.

In some embodiments of the present invention, a semiconductor device with an in situ formed horizontal nanowire structure is provided. The semiconductor device comprises a semiconductor layer of a Group III-V semiconductor material on a planar substrate, for example a semiconductor wafer, and a dielectric layer covering the semiconductor layer. The semiconductor device further comprises a semiconductor growth having a predefined asymmetrical geometry. The semiconductor growth is coplanar with a surface of the semiconductor device and extends through the dielectric layer to the semiconductor layer. The semiconductor growth may comprise the Group III-V semiconductor material. The semiconductor device further comprises a predefined linear crack of nanoscale width in both the dielectric layer and the semiconductor layer. The predefined linear crack extends horizontally from a location in a vicinity of the semiconductor growth along a crystal plane of the semiconductor layer. The predefined linear crack comprises a uniformly linear horizontal nanowire structure of the Group III-V semiconductor material.

In some embodiments, the semiconductor device further comprises another asymmetrical growth spaced apart from the semiconductor growth of predefined asymmetrical geometry. In these embodiments, the predefined linear crack extends horizontally between the semiconductor growth and the other asymmetrical growth. Moreover, the uniformly linear horizontal nanowire structure in the predefined linear crack is in contact with the semiconductor growth at one end and the other asymmetrical growth at an opposite end of the uniformly linear horizontal nanowire structure.

The perspective views in FIGS. 4C and 6 further illustrate representations of a portion of the semiconductor device in examples in accordance with the principles described herein. For example, the semiconductor device comprises a semiconductor layer 203 on a planar substrate 201, for example a semiconductor wafer. The semiconductor layer may be a Group III-V compound semiconductor, as described herein. A dielectric layer 205 covers at least a portion of the semiconductor layer 203. A semiconductor growth 210 protrudes from a surface of the semiconductor device. Although not illustrated in either FIG. 4C or 6, the semiconductor growth 210 also extends through the dielectric layer 205 to the semiconductor layer 203. The semiconductor growth 210 has an asymmetrical polygonal geometry, based on the planar asymmetrical geometry of the asymmetrical selective area opening 207 through which the semiconductor growth 210 is formed. A rectangular geometry is illustrated in FIGS. 4C and 6 by way of example and not limitation.

The semiconductor device further comprises a uniformly linear horizontally oriented nanowire structure 220 in a linear crack 209. In the embodiment illustrated in FIG. 6, the semiconductor device further comprises another growth of predefined asymmetric geometry 212. The uniformly linear horizontally oriented nanowire structure 220 has a first end adjacent to the semiconductor growth 210 and a second end adjacent to the other growth 212.

In some embodiments, the asymmetrical polygon of the openings through which the semiconductor growths 210, 212 emanate has a length to width aspect ratio within a range of about 1.5 to about 6, or in some embodiments, equal to or greater than about 2 (not illustrated to scale in FIG. 4C or 6). The asymmetrical openings and corresponding semiconductor growths 210, 212 may have the same shape or be of different asymmetrical shapes and dimension. In some embodiments, the predefined asymmetric geometry of the asymmetrical openings in the dielectric layer 205 (e.g., opening 207 in FIG. 4C) and the corresponding geometry of the respective semiconductor growths 210, 212 are substantially the same as described above for the semiconductor growth formed in the patterned 110 selective area opening of the method 100 of fabricating horizontal nanowires in situ on a substrate or the formed 330. GaN growths in the defined 320 selective area openings of the method 300 of in situ formation of a gallium nitride (GaN) nanowire structure.

In some embodiments of the semiconductor device, the planar substrate is a sapphire wafer, for example, a semiconductor grade sapphire wafer. In some embodiments, the semiconductor layer of Group III-V semiconductor material is a Group III-nitride compound semiconductor, and in particular the semiconductor material layer may be gallium nitride (GaN). In some embodiments, the semiconductor material is substantially similar to any of the semiconductor materials described above with respect to the method 100 of fabricating horizontal nanowires in situ on a substrate and the method 300 of in situ formation of a gallium nitride (GaN) nanowire structure. For example, the semiconductor material of the semiconductor layer may have well-defined or deterministic crystal planes, and the linear crack may be located along a deterministic crystal plane of the semiconductor layer. In some embodiments, the predefined linear crack is along a <11-20> crystal axis of a GaN semiconductor material layer. Moreover, the material of the dielectric layer may be any of the dielectric mask materials described above with respect to the method 100 and the method 300. In some embodiments, the material of the dielectric layer is silicon dioxide.

In some embodiments, the semiconductor device may be fabricated with a nanowire structure in accordance with any of the embodiments and examples described above for the method 300 of in situ formation of a horizontally oriented gallium nitride (GaN) nanowire structure on a semiconductor device. In other embodiments, the semiconductor device may be fabricated with an in situ formed nanowire in accordance with any of the embodiments and examples described above for the method 100 of fabricating horizontal nanowires in situ on a substrate. Moreover, the uniformly linear horizontal nanowire structure may have substantially the same characteristics and properties as the in situ formed uniformly linear horizontal nanowire, as described above for the method 100 or the method 300. For example, in some embodiments of the semiconductor device, the uniformly linear horizontal nanowire structure has atomically smooth sidewalls. In some embodiments, the uniformly linear horizontal nanowire structure has six well-defined crystallographic directions. In addition, although not illustrated, the uniformly linear horizontal nanowire structure may be at least partially suspended above the semiconductor layer between the semiconductor growths, for example.

The semiconductor device described herein may be a component of a variety of a semiconductor devices or systems for which the in situ formed nanowire structure may provide one or more of optical, electrical and mechanical properties. The semiconductor devices or systems may include, but are not limited to, an optical waveguide, a high performance optical modulator, a transistor, a LED array, a laser, a chemical sensor, a piezo-electric transducer, a photovoltaic cell, a photodetector, a photocatalyst, or an array of solid-state spin quantum bits.

Figure 7:
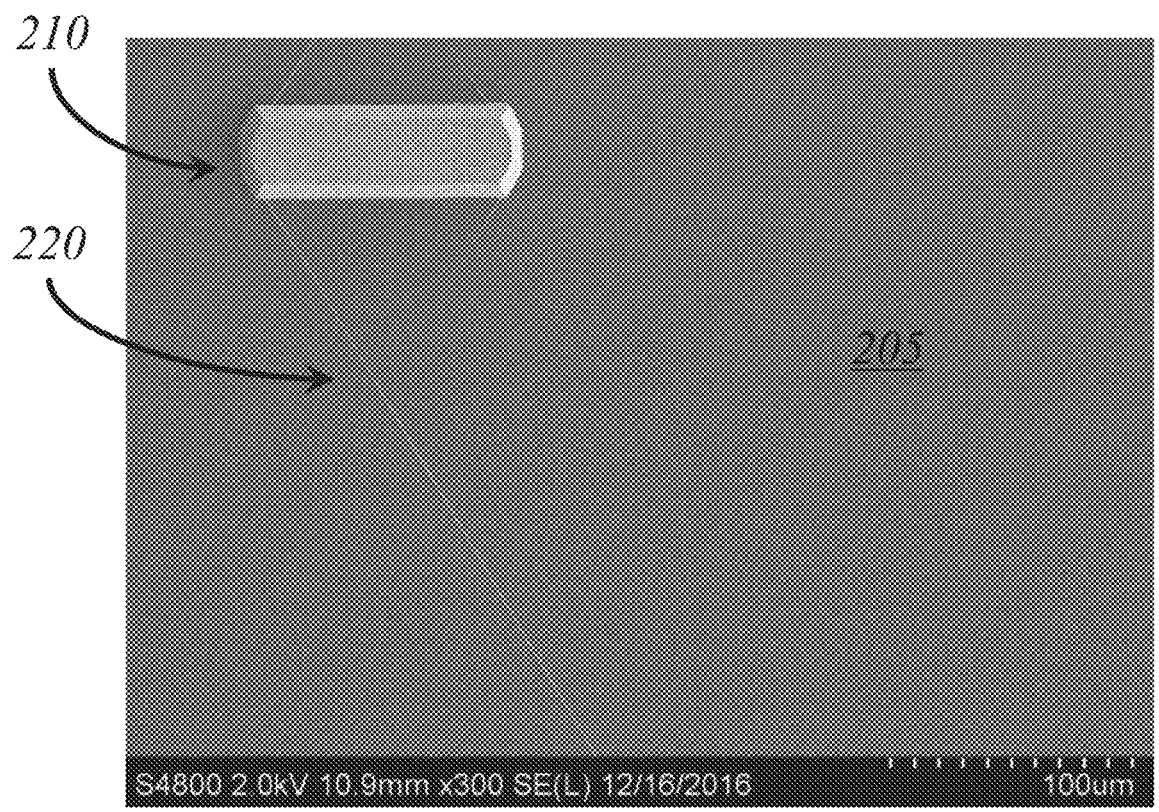
FIG. 7 illustrates a scanning electron micrograph (SEM) image of a top view of a planar surface having an asymmetrical semiconductor growth and four in situ formed uniformly linear nanowires in corresponding uniformly linear cracks extending from the asymmetrical semiconductor growth adjacent to four vertices in an example, according to an embodiment consistent with the principles of the present invention.
Figure 8:
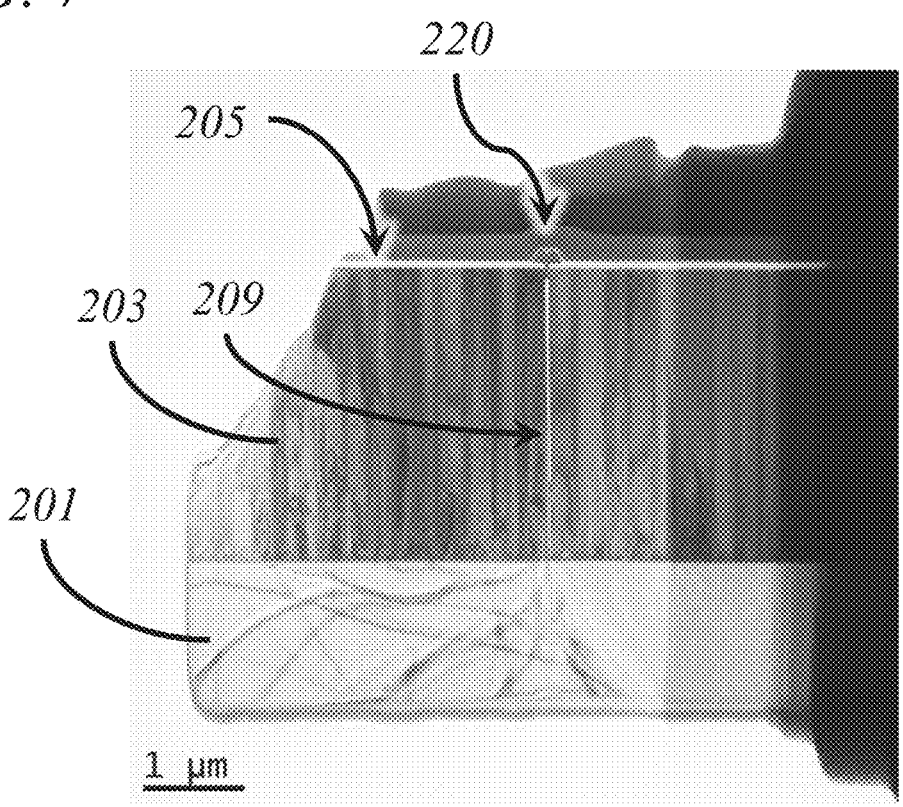
FIG. 8 illustrates a transmission electron micrograph (TEM) image of a cross sectional view of an in situ formed nanowire at a planar surface of substrate in an in situ formed crack in an example, according to an embodiment consistent with the principles of the present invention.

FIGS. 7 and 8 illustrate examples of fabricated horizontally oriented nanowires in situ on semiconductor wafers in accordance with the principles of the present invention, as described herein. FIG. 7 is a scanning electron micrograph (SEM) image in a top view of a dielectric layer surface of a planar semiconductor wafer having an asymmetrical semiconductor growth 210 and four in situ formed uniformly linear nanowires 220 (in corresponding uniformly linear cracks) extending from the asymmetrical semiconductor growth 210. The semiconductor growth 210 is GaN that was grown through a selective area opening in a silicon dioxide dielectric mask layer. The semiconductor growth 210 has an asymmetrical polygonal shape with at least four vertices. The four nanowires 220 are shown extending horizontally (coplanar with the surface) from adjacent to the four vertices of the semiconductor growth 210 in well-defined <11-20> directions of the GaN semiconductor layer in the example.

FIG. 8 illustrates a transmission electron micrograph (TEM) image in a cross sectional view of a nanowire 220 at a surface of a dielectric layer 205 on a planar substrate 201 in an example. The nanowire 220 was in situ formed in a crack 209 that was propagated in a semiconductor layer 203 and the dielectric layer 205 to the surface of the planar substrate 201. The planar substrate 201 was a sapphire wafer, the semiconductor material of the semiconductor layer 203 and of the nanowire 220 was GaN, and the dielectric layer was silicon dioxide. The crack 209 was propagated along a well-defined <11-20> crystal direction of the GaN semiconductor layer. The examples illustrated in FIGS. 7 and 8 were fabricated using the method 100 of fabricating horizontal nanowires in situ on a planar substrate, as described herein.

Thus, there have been described examples of methods of in situ fabrication of horizontal nanowires and in situ formation of a horizontal nanowire structure that employ non-catalytic selective area epitaxial growth in a selective area opening of predefined asymmetric geometry at a growth temperature sufficient to also induce a linear stress crack as a template for the horizontal nanowire. Moreover, a semiconductor device incorporating the horizontal nanowire structure is described. It should be understood that the above-described embodiments and examples are merely illustrative of some of the many specific examples and embodiments that represent the principles consistent with the principles described herein. Clearly, those skilled in the art can readily devise numerous other arrangements without departing from the scope consistent with the principles described herein as defined by the following claims.

What is claimed is:

1. A semiconductor device with an in situ formed horizontal nanowire structure, the semiconductor device comprising:
   a semiconductor layer of a Group III-V semiconductor material on a planar substrate;
   a dielectric layer covering the semiconductor layer;
   a semiconductor growth of the Group III-V semiconductor material having a predefined asymmetrical geometry, the semiconductor growth being coplanar with a surface of the semiconductor device and extending through the dielectric layer to the semiconductor layer; and
   a predefined linear crack of nanoscale width in both the dielectric layer and the semiconductor layer that extends horizontally from a location in a vicinity of the semiconductor growth along a crystal plane of the semiconductor layer, the predefined linear crack comprising a uniformly linear horizontal nanowire structure of the Group III-V semiconductor material.

2. The semiconductor device of claim 1, further comprising another growth spaced apart from the semiconductor growth, both the predefined linear crack and the uniformly linear horizontal nanowire structure extend between the semiconductor growth and other growth, wherein the uniformly linear horizontal nanowire structure has six well-defined crystallographic directions, the predefined asymmetrical geometry of the semiconductor growth has aspect ratio within a range of about 2 to about 6.

3. The semiconductor device of claim 1, wherein the planar substrate is a sapphire wafer, the dielectric layer comprising silicon dioxide, the Group III-V semiconductor material being gallium nitride (GaN), and wherein the crystal plane of the semiconductor layer is a crystal plane along a <11-20> crystal axis of the GaN, the uniformly linear horizontal nanowire structure having atomically smooth sidewalls.

4. The semiconductor device of claim 1, wherein the Group III-V semiconductor material is gallium nitride, and wherein the semiconductor device is a component of an optical waveguide, a high performance optical modulator, a transistor, a LED array, a laser, a chemical sensor, a piezoelectric transducer, a photovoltaic cell, a photodetector, a photocatalyst, or an array of solid-state spin quantum bits.

* * * * *